United States Patent [19]

Om et al.

[11] Patent Number: 5,770,505
[45] Date of Patent: Jun. 23, 1998

[54] METHOD FOR THE FABRICATION OF A SEMICONDUCTOR DEVICE

[75] Inventors: Jae Chul Om; Hyo Sik Park, both of Ichon-kun, Rep. of Korea

[73] Assignee: Hyundai Electronics Industries Co., Ltd, Kyoungki-do, Rep. of Korea

[21] Appl. No.: 854,055

[22] Filed: May 8, 1997

Related U.S. Application Data

[63] Continuation of Ser. No. 397,883, Mar. 2, 1995, abandoned.

[30] Foreign Application Priority Data

Mar. 3, 1994 [KR] Rep. of Korea ............... 1994-4114

[51] Int. Cl.[6] ............................................. H01L 21/336
[52] U.S. Cl. .......................................... 438/298; 438/305
[58] Field of Search ............................... 437/41, 44–45; 438/297–298, 305

[56] References Cited

U.S. PATENT DOCUMENTS 5,217,913  6/1993  Watabe et al. ........................ 437/44
5,401,678  3/1995  Jeong et al. ........................... 437/44
5,468,670  11/1995 Ryou .
5,523,250  6/1996  Jeong et al. ........................... 437/44

OTHER PUBLICATIONS

Wolf, "Silicon Processing for the VLSI Era, vol. 2: Process Integration", pp. 354–356, Lattice Press, 1990.

*Primary Examiner*—John Niebling
*Assistant Examiner*—Richard A. Booth
*Attorney, Agent, or Firm*—Gary M. Nath; Nath & Associates

[57] ABSTRACT

There are disclosed methods for the fabrication of semiconductor device. A junction leakage or defect which is generated at the bird's beak of field oxide film when forming an oxide film spacer at the side wall of a gate electrode in a MOSFET can be prevented by implanting a low density dopant or by sequentially implanting a high density dopant and a low density dopant into the substrate, subsequent to formation of the oxide film spacer.

1 Claim, 2 Drawing Sheets

METHOD FOR THE FABRICATION OF A SEMICONDUCTOR DEVICE

This application is a continuation of U.S. patent application Ser. No. 08/397,883, filed Mar. 2, 1995, now abandoned, the contents of which are incorporated herein in their entirety.

BACKGROUND OF THE INVENTION

1. Field of the Invention

The present invention relates, in general, to a method for the fabrication of a semiconductor device and, more particularly, to prevention of the occurrence of junction leakage and defect at the bird's beak of field oxide film when forming an oxide film spacer at the side wall of a gate electrode in a MOSFET.

2. Description of the Prior Art

A lightly doped drain (hereinafter referred to as "LDD") structure has been employed in a MOSFET, with the aim of preventing the deterioration of the device caused by a hot carrier.

Typically, the MOSFET with an LDD structure is fabricated by forming a gate electrode over a substrate having a field oxide film, implanting low density impurities into the substrate to form an LDD region, a diffusion region of low density impurity, coating a blanket oxide film over the resulting structure, subjecting the oxide film to dry etching to form an oxide spacer at the side wall of the gate electrode, and implanting high density impurities into the substrate, to form a source/drain region while migrating the LDD region into below the oxide spacer.

In the course of the fabrication of MOSFET, when the blanket oxide film for an oxide spacer is coated, the resultant topology on the substrate is poor due to the gate electrode and other factors. Thus, the coated oxide film comes to have nonuniform thickness. For example, in the case that the distance between two gate electrodes is short, the oxide film which is deposited on the gate electrode is thicker than that deposited on the substrate. Due to this difference in thickness, after etching the oxide film, the oxide film on the substrate is completely eliminated and even the field oxide film thus exposed is etched at some thickness. As a result, a shallow junction is exposed at an edge of the bird's beak of the field oxide film, which is a cause of junction leakage upon applying a bias to the source/drain region.

In order to better illustrate the background of the invention, the prior art will be described below with reference to some drawings.

Referring initially to FIGS. 1A and 1B, there is shown a conventional technique for fabricating a transistor in a cell region. The transistor shown in these figures employs an LDD region as a source/drain without implanting high density impurities additionally.

FIG. 1A shows a transistor which is fabricated by growing a field oxide film 1 on a predetermined area of a p type semiconductor substrate 20, forming respective gate oxide films 2 capped with gate electrode 3 on a predetermined area of the semiconductor substrate 20 and on the field oxide film 1, and implanting N type dopants in a small dose into the semiconductor substrate 20 to form an LDD region 5 with the gate electrode serving as a mask.

FIG. 1B is a cross section of the transistor after a blanket oxide film is deposited over the resulting structure of FIG. 1A, followed by formation of an oxide film spacer 7 at the side wall of the gate electrode 3. For formation of the oxide

2 film spacer 7, the blanket oxide film is subjected to anisotropic etching. At this time, the bird's beak of the field oxide film 1 is etched at some thickness, to expose a part "A", a side part of the LDD region 5, at an edge of the field oxide film 1. Such exposure of a shallow junction at an edge of the LDD region causes a junction leakage of the LDD region when applying a bias to the source and drain region.

Referring to FIGS. 2A and 2B, there is shown another technique 5 for fabricating a transistor.

FIG. 2A shows a transistor which is fabricated by growing a field oxide film 1' on a predetermined area of a p type semiconductor substrate 20', forming respective gate oxide films 2' capped with gate electrode 3' on a predetermined area of the semiconductor substrate 20' and on the field oxide film 1', and implanting N type dopants in a small dose into the semiconductor substrate 20' to form an LDD region 5' with the gate electrode serving as a mask.

FIG. 2B is a cross section after a blanket oxide film is deposited over the resulting structure of FIG. 2A and subjected to anisotropic etching, to form an oxide film spacer 7' at the side wall of the gate electrode 3', followed by implantation of high density N type dopants into the semiconductor substrate 20'. As a result of the implantation, a source 8 and a drain 9 are established in the semiconductor substrate 20'. Upon anisotropic etching, the bird's beak of the field oxide film 1 is cut down at some thickness. If the dopant implanted in a large dose is arsenic, which is larger than silicon in atom size, there is generated a defect 11 that the crystalline structure of the silicon substrate 20' is destroyed at a part "A'", a side part of the source 8 beside an edge of the field oxide film 1'. Owing to this defect 11, a depletion layer is formed in an area including the defect, leading to the generation of a punchthrough effect which causes, in turn, a breakdown effect. To relieve the damage of the silicon crystalline structure in the semiconductor substrate, an annealing step at 800° C. is typically undertaken. In spite of the annealing step, it is virtually impossible to completely remove the defect because arsenic dopants implanted in the semiconductor substrate are larger than silicon in size.

As described above, the conventional transistors exhibit a junction leakage at an edge of a field oxide film, attributable to an overdue etching of the field oxide film while forming the oxide film spacer or such an extreme junction leakage as to generate a breakdown effect, attributable to implantation of high density impurity. Since there is adopted an operation of the read and write of cell as a sensing method for charge, especially, in DRAM, the leakage current deteriorates a trait of refresh time, characteristic in DRAM.

SUMMARY OF THE INVENTION

It is a primary object of the present invention to provide a method for the fabrication of a semiconductor device, preventive of exposing the side of the LDD region.

It is another object of the present invention to provide a method for the fabrication of a semiconductor device, preventive of generating defects in a semiconductor substrate.

In accordance with a view of the present invention, there is provided a method for the fabrication of a semiconductor device, comprising the steps of: forming a field oxide film on a semiconductor substrate; forming a gate oxide and a gate electrode, in sequence; implanting a first low density dopant into the semiconductor substrate, to form a first LDD region; forming an oxide film spacer at the side wall of the gate electrode by depositing a blanket oxide film and subjecting the blanket oxide film to anisotropic etching; and implanting a second low density dopant with a large diffusion coefficient into the semiconductor substrate, to form a second LDD region in an area at which the semiconductor substrate is exposed by cutting down the field oxide film upon the anisotropic etching of the oxide film.

In accordance with another view of the present invention, there is provided a method for the fabrication of a semiconductor device, comprising the steps of: forming a field oxide film on a semiconductor substrate: forming a gate oxide and a gate electrode, in sequence; implanting a first low density dopant into the semiconductor substrate, to form a first LoD region; forming an oxide film spacer at the side wall of the gate electrode by depositing a blanket oxide film and subjecting the blanket oxide film to anisotropic etching; implanting a second high density dopant into the semiconductor substrate, to form a source and a drain; implanting a third low density dopant with a large diffusion coefficient into the semiconductor substrate, to form a second LDD region in an area at which the semiconductor substrate is exposed by cutting down the field oxide film upon the anisotropic etching of the oxide film.

BRIEF DESCRIPTION OF THE DRAWINGS

The above objects and other advantages of the present invention will become more apparent by describing in detail the preferred embodiments of the present invention with reference to the attached drawings in which.

DETAILED DESCRIPTION OF THE PREFERRED EMBODIMENTS

Figure 1A:
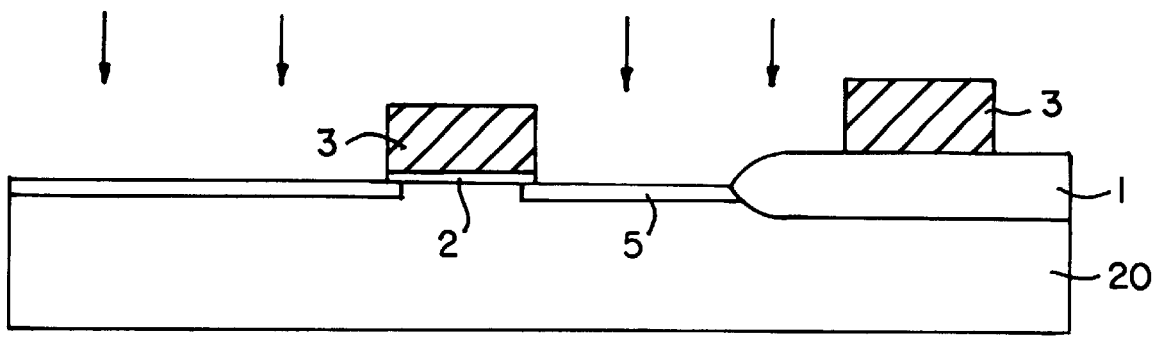
FIGS. 1A and 1B are schematic cross sectional views showing a conventional technique for fabricating a transistor.

The application of the preferred embodiments of the present invention is best understood with reference to the accompanying drawings, wherein like reference numerals are used for like and corresponding parts, respectively.

Figure 1B:
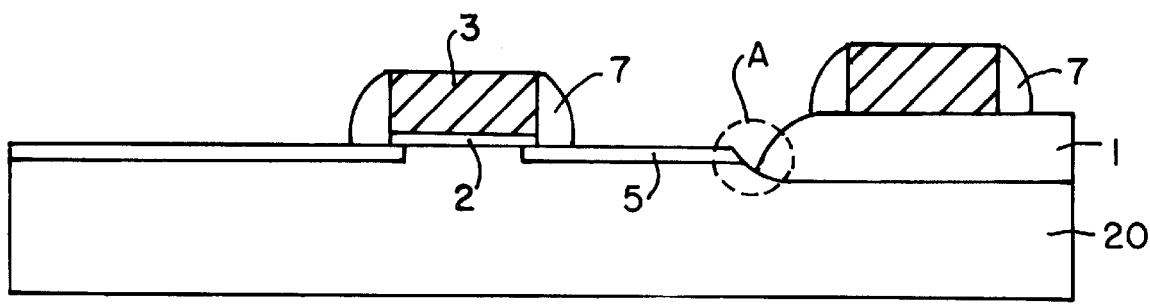
Figure 3:
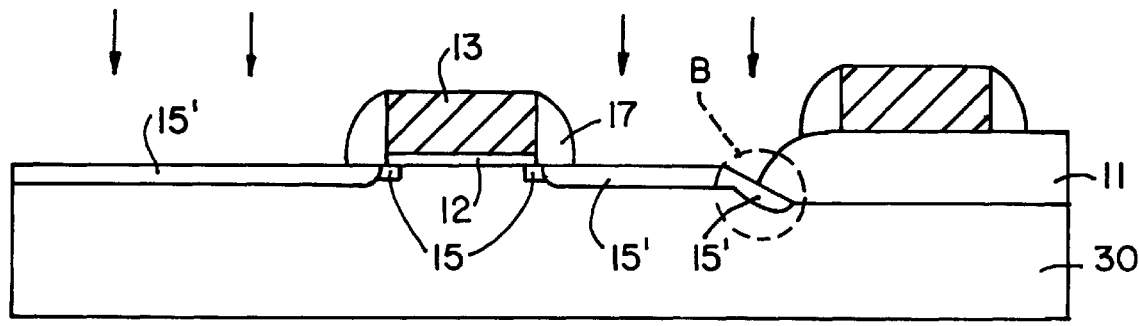
FIG. 3 is a schematic cross sectional view showing a MOSFET fabricated by a method according to an embodiment of the present invention.

Referring to FIG. 3, there is shown a MOSFET, according to an embodiment of the present invention. For this MOSFET, N type dopants are further implanted in a small dose after establishing the same transistor as in FIG. 1. That is, The MOSFET according to an embodiment of the present invention is fabricated by growing a field oxide film 11 on a predetermined area of a p type semiconductor substrate 30, forming respective gate oxide films 12 capped with gate electrode 13 on a predetermined area of the semiconductor substrate 30 and on the field oxide film 11, and implanting first N type dopants in a small dose into the semiconductor substrate 30 to form a first LDD region 15 with the gate electrode serving as a mask, depositing a blanket oxide film over the resulting structure, subjecting the oxide film to anisotropic etching to form an oxide film spacer 17 at the side wall of the gate electrode 13 and further implanting second N type dopants with a large diffusion coefficient in a small dose into the semiconductor substrate 30, to form a second LDD region 15'.

The N type dopants with a large diffusion coefficient are implanted into a part "B" in which an area of the semiconductor substrate 30 is exposed as a result of cutting down the field oxide film 11 upon anisotropic etching. Thus, the subsequent implantation can prevent the generation of junction leakage.

There is a trend that only an LDD region formed by implantation of low density dopant is used as a source and drain in a MOSFET for DRAM or SRAM which is operable at low voltages and improved in leakage current.

Figure 2A:
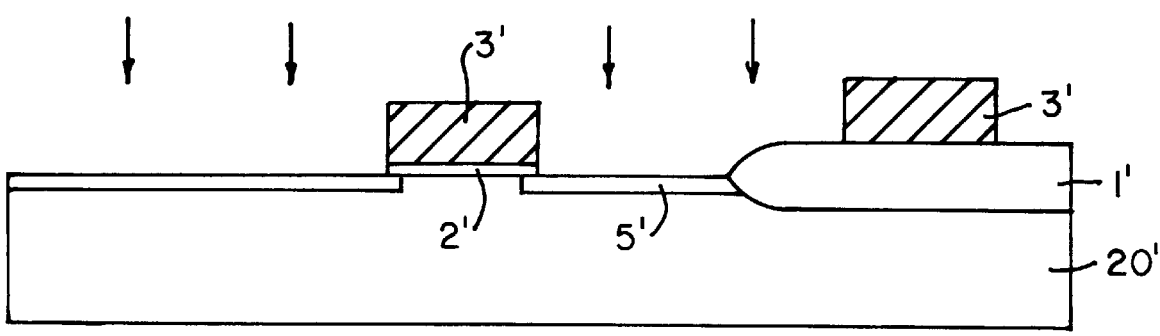
FIGS. 2A and 2B are schematic cross sectional views showing another conventional technique for fabricating a transistor.
Figure 2B:
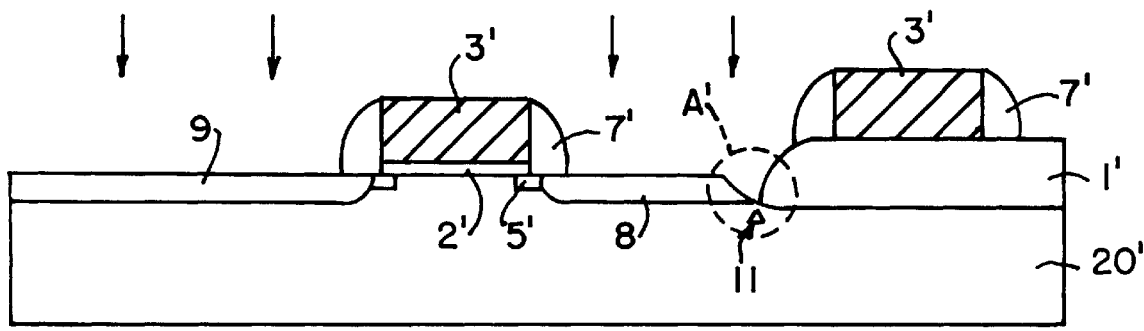
Figure 4:
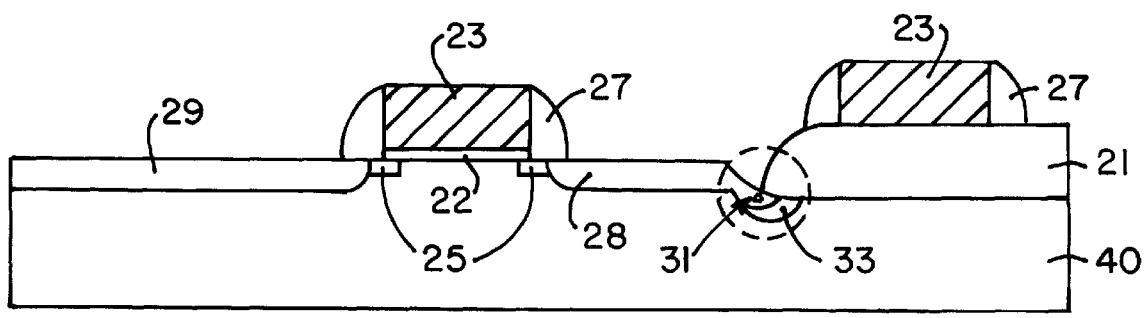
FIG. 4 is a schematic cross sectional view showing a MOSFET fabricated by a method according to another embodiment of the present invention.

Referring to FIG. 4, there is shown a MOSFET, according to another embodiment of the present invention. For this MOSFET, N type dopants are further implanted in a large dose after establishing the same transistor as in FIG. 2. That is, the MOSFET according to another embodiment of the present invention is fabricated by growing a field oxide film 21 on a predetermined area of a p type semiconductor substrate 40, forming respective gate oxide films 22 capped with gate electrode 23 on a predetermined area of the semiconductor substrate 40 and on the field oxide film 21, implanting first N type dopants in a small dose into the semiconductor substrate 40 to form a first LDD region 25 with the gate electrode serving as a mask, depositing a blanket oxide film over the resulting structure, subjecting the blanket oxide film to anisotropic etching, to form an oxide film spacer 27 at the side wall of the gate electrode 23, implanting second N type dopants, for example, arsenic, in a large dose of, for example, about $1 \times 10^{19}$ to about $1 \times 10^{20}$ at an acceleration energy of about 20 to 50 KeV into the semiconductor substrate 40, to form a source 28 and a drain 29 and further implanting second N type dopants with a large diffusion coefficient, for example, phosphorous, in a small dose of, for example, about $1 \times 10^{18}$ to about $1 \times 10^{19}$ into the semiconductor substrate 40, to form a second LDD region 33.

The second LDD region 33 surrounds a defect 31 which is generated when, for example, arsenic dopant, larger than silicon in size, is implanted, obstructing the defect in migration into a depletion layer with ease. Thus, the punchthrough effect can be prevented.

As described hereinbefore, even though the defect is generated in a semiconductor substrate by implanting high density dopants in the course of fabricating a MOSFET of LDD structure useful in a highly integrated circuit, the defect is prevented from migrating into a depletion layer by virtue of an LDD region which is formed by implanting low density dopants into the area below the defect, in accordance with the present invention. Therefore, the methods according to the present invention can reduce junction leakage current in addition to preventing the punchthrough effect attributable to the depletion layer. Further, the transistors of the present invention show reduced faulty operation and power consumption. Furthermore, there is prevented the voltage change and faulty operation attributed to junction leakage current in an analog circuit of SRAM or DRAM. In addition, the refresh time trait in DRAM can be improved.

Other features, advantages and embodiments of the invention disclosed herein will be readily apparent to those exercising ordinary skill after reading the foregoing disclosures. In this regard, while specific embodiments of the invention have been described in considerable detail, variations and modifications of these embodiments can be effected without departing from the spirit and scope of the invention as described and claimed.

What is claimed is:

1. A method for the fabrication of a semiconductor device, comprising the steps of:

forming a field oxide film on a semiconductor substrate;

forming a gate oxide and a gate electrode, in sequence;

implanting a dopant at a low density into the semiconductor substrate, to form an LDD region;

forming an oxide film spacer at the side wall of the gate electrode by depositing a blanket oxide film and subjecting the blanket oxide film to anisotropic etching;

implanting an arsenic dopant at a high density into the semiconductor substrate, to form a source and a drain;

implanting a phosphorus dopant at a low density into the semiconductor substrate, to form a lightly doped region in the portion of the source which is disposed on the bottom of an area at which the semiconductor substrate is exposed by etching an edge portion of the field oxide film upon the anisotropic etching of the field oxide film.

* * * * *